United States Patent
Yang et al.

(10) Patent No.: US 12,282,052 B2
(45) Date of Patent: Apr. 22, 2025

(54) BUS AUTHENTICATION AND ANTI-PROBING ARCHITECTURE

(71) Applicant: University of Rhode Island Board of Trustees, Kingston, RI (US)

(72) Inventors: Ken Qing Yang, Saunderstown, RI (US); Tao Wei, West Kingston, RI (US); Zhenyu Xu, Kingston, RI (US)

(73) Assignee: University of Rhode Island Board of Trustees, Kingston, RI (US)

( * ) Notice: Subject to any disclaimer, the term of this patent is extended or adjusted under 35 U.S.C. 154(b) by 6 days.

(21) Appl. No.: 17/795,997

(22) PCT Filed: Jan. 29, 2021

(86) PCT No.: PCT/US2021/015743
§ 371 (c)(1),
(2) Date: Jul. 28, 2022

(87) PCT Pub. No.: WO2021/155176
PCT Pub. Date: Aug. 5, 2021

(65) Prior Publication Data
US 2023/0050241 A1    Feb. 16, 2023

Related U.S. Application Data

(60) Provisional application No. 62/967,786, filed on Jan. 30, 2020.

(51) Int. Cl.
*G01R 31/11* (2006.01)
*G01R 31/08* (2020.01)
(52) U.S. Cl.
CPC ............ *G01R 31/11* (2013.01); *G01R 31/085* (2013.01)

(58) Field of Classification Search
CPC ......... G01R 31/11; G01R 31/085; H03F 1/02; H03F 1/32; H03F 3/19; H03F 3/24; H04B 1/04
(Continued)

(56) References Cited

U.S. PATENT DOCUMENTS 4,697,183 A    9/1987   Jenning et al.
5,053,693 A    10/1991  Bohnert et al.
(Continued)

FOREIGN PATENT DOCUMENTS

CN    1666109 A    9/2005

OTHER PUBLICATIONS

Razavi, B. , "Design of Analog CMOS Integrated Circuits, Second Edition", McGraw Hill Education, 2017, 704.
(Continued)

*Primary Examiner* — Raul J Rios Russo
*Assistant Examiner* — Trung Q Nguyen
(74) *Attorney, Agent, or Firm* — Philip D. Askenazy; Peacock Law P.C.

(57) ABSTRACT

Method and apparatus for detecting in impedance change in a transmission line, such as a line in a computer bus. A CMOS-compatible time domain reflectometer circuit comprising a comparator is embedded in one or more chips and connected to the transmission line. The circuit measures the impedance inhomogeneity pattern (IIP) of the transmission line prior to use, and then repeatedly measures the HP during operation of the transmission line to detect a change in IIP, without Interfering with data transfer through the transmission line. The present invention can detect and locate wire-tapping magnetic probing or snooping, and Trojan and cold boot attacks on interconnecting buses between computer chips or integrated circuits in a computer system, such as on external memory buses.

9 Claims, 10 Drawing Sheets

(58) Field of Classification Search
USPC .................. 324/500, 600, 534, 76.11, 763.01
See application file for complete search history.

(56) References Cited

U.S. PATENT DOCUMENTS

| | | | |
|---|---|---|---|
| 6,644,114 | B1 | 11/2003 | McEwan |
| 6,980,028 | B1 | 12/2005 | Plants et al. |
| 9,143,236 | B1 | 9/2015 | Bartur et al. |
| 10,891,869 | B1* | 1/2021 | McIntosh ............... G08G 5/045 |
| 11,105,879 | B1* | 8/2021 | Cao ......................... G01R 27/04 |
| 11,474,141 | B1 | 10/2022 | Wei et al. |
| 2002/0130667 | A1 | 9/2002 | Noe |
| 2003/0009683 | A1 | 1/2003 | Schwenck et al. |
| 2003/0038618 | A1 | 2/2003 | Gumm |
| 2003/0235306 | A1 | 12/2003 | Fox et al. |
| 2005/0068244 | A1 | 3/2005 | Downs et al. |
| 2005/0264297 | A1* | 12/2005 | Gorka ..................... G01R 27/04 324/525 |
| 2005/0270091 | A1 | 12/2005 | Kozyrev et al. |
| 2006/0261259 | A1 | 11/2006 | Beinhocker |
| 2008/0048726 | A1* | 2/2008 | Hafed ............... G01R 31/31725 702/69 |
| 2009/0218401 | A1 | 9/2009 | Moran et al. |
| 2009/0315565 | A1* | 12/2009 | Wyar ...................... G01R 31/11 324/533 |
| 2010/0073014 | A1 | 3/2010 | Maslen |
| 2010/0118292 | A1 | 5/2010 | Park et al. |
| 2010/0277184 | A1 | 11/2010 | Geren |
| 2011/0181871 | A1 | 7/2011 | Childers et al. |
| 2015/0084660 | A1* | 3/2015 | Knierim ............... G01R 35/002 324/149 |
| 2019/0129026 | A1 | 5/2019 | Sumi et al. |
| 2020/0356085 | A1* | 11/2020 | Wentz .................. H04L 9/0866 |

OTHER PUBLICATIONS

Ren, L., et al., "Design and implementation of the ascend secure processor", IEEE Transactions and Dependable and Secure Computing, vol. 16, No. 2, 2017, 204-216.

Riera, A., et al., "Unobstrusive biometric system based on electroencephalogram analysis", EURASIP J. Adv. Signal Process, vol. 2008, Art. No. 143728, Oct. 2007, 1-8.

Rixner, S., et al., "Memory access scheduling", ACM SIGARCH Computer Architecture News, vol. 28, No. 2, ACM, 2000, 128-138.

Rogers, B., et al., "Using address independent seed encryption and bonsai merkle trees to make secure processors ps-and performance-friendly", Proceedings of the 40th Annual IEEE/ACM International Symposium on Microarchitecture, IEEE Computer Society, 2007, 183-196.

Sadeghi, A. R., et al., "Security and privacy challenges in industrial internet of things", 2015 52nd ACM/EDAC/IEEE Design Automation Conference (DAC), IEEE, 2015, 1-6.

Saileshwar, G., et al., "Morphable counters: Establishing compact integrity trees for low-overhead secure memories", 2018 51st Annual IEEE/ACM International Symposium on Microarchitecture (Micro), IEEE, 2018, 416-427.

Saileshwar, G., et al., "Synergy: Rethinking secure-memory design for error-correcting memories", 2018 IEEE International Symposium on High Performance Computer Architecture (HPCA), IEEE, 2018, 454-465.

Santos, N., et al., "Towards Trusted Cloud Computing", HotCloud, vol. 9, No. 9, 2009, 3.

Seaborn, M., et al., "Exploiting the DRAM rowhammer bug to gain kernel privileges", Black Hat, vol. 15, 2015.

Sehatbakhsh, N., et al., "Emma: Hardware/software attestation framework for embedded systems using electromagnetic signals", Proceedings of the 52nd Annual IEEE/ACM International Symposium on Microarchitecture, Association for Computing Machinery, 2019, 983-995.

Smith, S. W., et al., "Building a high-performance, programmable secure coprocessor", Computer Networks, Vo. 31, No. 8, 1999, 831-860.

Stefanov, E., et al., "Path ORAM: an extremely simple oblivious RAM protocol", Proceedings of the 2013 ACM SIGSAC Conference on Computer & Communications Security, ACM, 2013, 299-310.

Stove, A. G., "Linear FMCW radar techniques", IEEE Proc. F Radar Signal Process., vol. 139, No. 5, Oct. 1992, 343-350.

Sudharani, K., et al., "Studies on Coding Techniques and It's Application to OTDR", Project Report, Department of Electronics & Communication Engineering, National Institute of Technology, Rourkela, India, 2009.

Suh, G. E., et al., "AEGIS: architecture for tamper-evident and tamper-resistance processing", ACM International Conference on Supercomputing 25th Anniversary vol. ACM, 2014, 357-368.

Suh, G. E., et al., "Design and implementation of the AEGIS single-chip secure processor using physical random functions", ACM SIGARCH Computer Architecture News, vol. 33, No. 2, IEEE Computer Society, 2005, 25-36.

Suh, G. E., et al., "Physical unclonable functions for device authentication and secret key generation", 2007 44th ACM/IEEE Design Automation Conference, IEEE, 2007, 9-14.

Tateda, Mitshuhiro, et al., "Advances in optical time domain reflectometry", Journal of Lightwave Technology, vol. 7, No. 8, Aug. 1989, 1217-1224.

Trikalinou, A., et al., "Taking DMA Attacks to the Next Level", BlackHat USA 2017, Las Vegas, NV, Jul. 22-27, 2017.

Trusted Computing Group, "Trusted Platform Module (TPM) Summary", https://trustedcomputinggroup.org/resource/trusted-platform-module-tpm-summary, downloaded Mar. 1, 2021, 2008.

Van Bulck, J., et al., "Foreshadow: Extracting the keys to the intel {SGX} kingdom with transient out-of-order execution", 27th {USENIX} Security Symposium ({USENIX} Security 18), 2018, 991-1008.

Vogt, P., et al., "Cross Site Scripting Prevention with Dynamic Data Tainting and Static Analysis", NDSS, vol. 2007, 2007, 12.

Wang, R., et al., "D-ORAM: Path-ORAM delegation for low execution interference on cloud servers with untrusted memory", 2018 IEEE International Symposium on High Performance Computer Architecture (HPCA), IEEE, 2018, 416-427.

Wang, Y., et al., "SecDCP: secure dynamic cache partitioning for efficient timing channel protection", Proceedings of the 53rd Annual Design Automation Conference, ACM, 2016, 74.

Wei, T., et al., "Transmission Line Identification via Impedance Inhomogeneity Pattern", IEEE Journal of Radio Frequency Identification, vol. 3, No. 4, Dec. 2019, 245-251.

Weisse, O., et al., "NDA: Preventing Speculative Execution Attaches at Their Source", Proceedings of the 52nd Annual IEEE/ACM International Symposium on Microarchitecture, ACM, 2019, 572-586.

Werner, M., et al., "Transparent memory encryption and authentication", 2017 27th International Conference on Field Programmable Logic and Applications, FPL 2017, IEEE, 2017, 1-6.

Whetsel, L., "An IEEE 1149.1 Based Logic/Signature Analyzer in a Chip", ITC, 1991, 869-878.

Xilinx, "UltraScale Architecture SelectIO Resources User Guide UG571 (v1.5)", Nov. 24, 2015.

Xilinx, "UltraScale Architecture-Based FPGAs Memory IP v1.4 LogiCore IP Product Guide, Vivado Design Suite", Oct. 22, 2021.

Xilinx, Inc., "Versal Architecture and Product Data Sheet: Overview", https://dokumen.tips/documents/versal-architecture-and-product-data-sheet-overview-ds950-prime-series-the.html?page=1, Downloaded Jun. 13, 2022, Oct. 2, 2018.

Xu, Z., et al., "A Bus Authentication and Anti-Probing Arachitecture Extending Hardware Trusted Computing Base off CPU Chips and beyond", Proceedings—International Symposium on Computer Architecture, 2020, 749-761.

Yan, C., et al., "Improving cost, performance, and security of memory encryption and authentication", ACM SIGARCH Computer Architecture News, vol. 34, No. 2, IEEE Computer Society, 2006, 179-190.

Yang, K., et al., "A2: Analog malicious hardware", 2016 IEEE Symposium on Security and Privact (SP), IEEE, 2016, 18-37.

(56) References Cited

OTHER PUBLICATIONS

Yang, J., et al., "Fast Secure Processor for inhibiting software piracy and tampering", Proceedings of the 36th Annual IEEE/ACM International Symposium on Microarchitecture, IEEE Computer Society, 2003, 351.

Yao, Z., et al., "Digitally Integrated Self-Trained Predistortion Curve Finder for Passive Sweep Linearization of Semiconductor Lasers", IEEE J. Sel. Top. Quantum Electron., vol. 25, No. 6, Nov. 12, 2019.

Yao, Z., et al., "Low-cost optical fiber physical unclonable function reader baed on a digitally integrated semiconductor LiDAR", Appl. Opt., vol. 58, No. 23, Aug. 10, 2019, 6211-6216.

Yao, Z., et al., "Low-cost optical fiber physical unclonable function reader based on a digitally integrated semiconductor LiDAR", Applied Optics, vol. 58, No. 23, Aug. 2019, 6211-6216.

Yitbarek, S. F., et al., "Cold boot attacks are still hot: Security analysis of memory scramblers in modern processors", 2017 IEEE International Symposium on High Performance Computer Architecture (HPCA), IEEE, 2017, 313-324.

Young, V., et al., "DEUCE: Write-efficient encryption for non-volatile memories", ACM SIGPLAN Notices, vol. 50, No. 4, 2015, 33-44.

Zhang, F., et al., "Robust counterfeit pcb detection exploting intrinsic trace impedance variations", 2015 IEEE 33rd VLSI Test Symposium (VTS), IEEE, 2015, 1-6.

Zhu, C., et al., "Truly distributed coaxial cable sensing based on random inhomogeneities", IEEE Trans. Instrum. Meas., vol. 68, No. 11, Nov. 2019, 4600-4607.

Zinsou, R., et al., "Recent progress in the performance enhancement of phase-sensitive OTDR vibration sensing systems", Sensors, vol. 19, No. 7, 2019, 1709-1728.

Adam, D.S. Christian, et al., "Analog-to-Probability Conversion-Efficient Extraction of Information Based on Stochastic Signal Models", Progress in Industrial Mathematics at ECMI 2018, Springer International Publishing, 2019, 583-587.

Aga, S., et al., "Invisimem: Smart memory defenses for memory bus side channel", ACM SIGARCH Computer Architecture News, vol. 45, No. 2, 2017, 94-106.

Aleph, O., "Smashing the stack for fun and profit", http://www.shmoo.com/phrack/Phrack49/p49-14, downloaded Mar. 1, 2021, 1996.

Altera Corporation, "DDR2, DDR3, and DDR4 SDRAM Board Design Guidelines", https://documents.pub/document/ddr2-ddr3-and-ddr4-sdram-board-design-guidelines-4-ddr3-and-ddr4-sdram-board.html?page=1, Dec. 16, 2013.

Arm Architecture, "Security technology building a secure system using trustzone technology", (White Paper), 2009.

Arnautov, S., et al., "(SCONE): Secure linux containers with intel (SGX)", 12th (USENIX) Symposium on Operating Systems Design and Implementation, 2016, 689-703.

Arnold, T. W., et al., "IBM 4765 cryptographic coprocessor", IBM Journal of Research and Development, vol. 56, No. 1.2, 2012, 10-11.

Awad, A., et al., "Obfusmem: A low-overhead access obfuscation for trusted memories", ACM SIGARCH Computer Architecture News, vol. 45, No. 2, ACM, 2017, 107-119.

Awad, A., et al., "Triad-nvm: Persistency for integrity-protected and encrypted non-volatile memories", Proceedings of the 45th International Symposium on Computer Architecture, ACM, 2019, 104-115.

Aziz, P. M., et al., "An overview of sigma-delta converters", IEEE Signal Processing Magazine, vol. 13, No. 1, 1996, 61-84.

Barber, K., et al., "Specshield: Shielding speculative data from microarchitectural covert channels", 28th International Conference on Parallel Architectures and Compilation Techniques (PACT), IEEE, 2019, 151-164.

Bar-El, H., et al., "The sorcerer's apprentice guide to fault attacks", Proceedings of the IEEE, vol. 94, No. 2, 2006, 370-382.

Barenghi, A., et al., "Fault injection attacks on cryptographic devices: Theory, practice, and countermeasures", Proceedings of the IEEE, vol. 100, No. 11, 2012, 3056-3076.

Barnoski, M. K., et al., "Fiber waveguides: a novel technique for investigating attenuation characteristics", Appl. Opt., vol. 15, No. 9, 1976, 2112-2115.

Baumann, A., et al., "Shielding applications from an untrusted cloud with haven", ACM Transactions on Computer Systems (TOCS), vol. 33, No. 3, 2015, 8.

Bellare, M., et al., "A concrete security treatment of symmetric encryption", Proceedings 38th Annual Symposium on Foundations of Computer Science, IEEE, 1997, 394-403.

Bellare, M., et al., "Keying hash functions for message authentication", Annual International Cryptology Conference, Springer, 1996, 1-15.

Bishop, J. A., et al., "A Rapid-Acquisition Electrical Time-Domain Reflectometer for Dynamic Structure Analysis", IEEE Trans. Instrum. Meas., vol. 60, No. 2, 2011, 655-661.

Champagne, D., et al., "Scalable Architectural support for trusted software", HPCA-16 2010 The Sixteenth International Symposium on High-Performance Computer Architecture, IEEE, 2010, 1-12.

Chari, S., et al., "Towards sound approaches to counteract power-analysis attacks", Annual International Cryptology Conference, Springer, 1999, 398-412.

Chean, V., et al., "Study of the mechanical behavior of the optical fiber by a mark-tracking method", EPJ Web of Conferences, vol. 6, 2010, 34002-1-8.

Chen, Zhen, et al., "FiberID: Molecular-level secret for identification of things", 2014 IEEE International Workshop on Information Forensics and Security, 10.1109/WIFS.2014.7084308, 2014.

Chen, X., et al., "Universal Fiber for Short-Distance Optical Communications", J. Light Technol., vol. 37, No. 2, 2019, 389-395.

Corey, S. D., et al., "Interconnect characterization using time-domain reflectometry", IEEE Transactions on Microwave Theory and Techniques, vol. 43, No. 9, 1995, 2151-2156.

Costan, V., et al., "Sanctum: Minimal hardware extensions for strong software isolation", 25th (USENIX) Security Symposium ({USENIX} Security 16), 2016, 857-874.

Cowan, C., et al., "Buffer overflows: Attacks and defenses for the vulnerability of the decade", Proceedings DARPA Information Survivability Conference and Exposition DISCEX '00, vol. 2, IEEE, 2000, 119-129.

Cuppu, V., et al., "A performance comparison of contemporary DRAM architectures", ACM SIGARCH Computer Architecture News, vol. 27, No. 2, IEEE Computer Society, 222-233, 1999.

Daigneault, M. A., et al., "A high-resolution time-to-digital converter on FPGA using dynamic reconfiguration", IEEE Transactions on Instrumentation and Measurement, vol. 60, No. 6, 2011, 2070-2079.

Dayeol, Lee, et al., "An off-chip attack on hardware enclaves via the memory bus", 29th USENIX Security Symposium, Aug. 12-14, 2020, Virtual Event, 2020.

Dong, X., et al., "Combined Attenuation and High-Resolution Fault Measurements Using Chaos-OTDR", IEEE Photonics J., vol. 7, No. 6, 2015, 1-6.

Du, Y., et al., "Unclonable optical fiber identification based on Rayleigh backscattering signatures", J. Lightw. Technol., vol. 35, No. 21, Nov. 1, 2017, 4634-4640.

EE Times, "Maxim: Secure Supervisor ic has active tamper detection", https://www.eetimes.com/maxim-secure-supervisor-ic-has-active-tamper-detection, downloaded Mar. 1, 2021, 2009.

Fang, H., et al., "Prefetch-guard: Leveraging hardware prefetches to defend against cache timing channels", 2018 IEEE International Symposium on Hardware Oriented Security and Trust (HOST), IEEE, 2018, 187-190.

Favi, C., et al., "A 17ps time-to-digital converter implemented in 65nm technology", Proceedings of the 7th ACM SIGDA International Symposium on Field-Programmable Gate Arrays, FPGA '09, 2009, 113-120.

Fletcher, C. W., et al., "Freecursive oram: [nearly] free recursion and integrity verification for position-based oblivious ram", ACM SIGARCH Computer Architecture News, vol. 43, No. 1, 2015, 103-116.

(56) References Cited

OTHER PUBLICATIONS

Froggatt, M., et al., "High-spatial-resolution distributed strain measurement in optical fiber with Rayleigh scatter", Applied Optics, vol. 37, Apr. 1, 1998, 1735-1740.

Getsinger, W. J., "An introduction to microwave transmission lines", Proc. 35th Midwest Symp. Circuits Syste., vol. 2, 1992, 1016-1019.

Gruss, D., et al., "Rowhammer.js: A remote software-induced fault attack in javascript", International Conference on Detection of Intrusions and Malware, and Vulnerability Assessment, Springer, 2016, 300-321.

Gueron, S., "Memory encryption for general-purpose processors", IEEE Security and Privacy, vol. 14, No. 6, 2016, 54-62.

Gupta, S., et al., "Cross-Site Scripting (XSS) attacks and defense mechanisms: classification and state-of-the-art", International Journal of System Assurance Engineering and Management, vol. 8, No. 1, 2017, 512-530.

Halderman, J. A., et al., "Lest we remember: cold-boot attacks on encryption keys", Communications of the ACM, vol. 52, No. 5, 2009, 91-98.

Hartog, A. H., "Advances in optical time domain reflectometry", Symposium on Optical Fiber Measurements, Mar. 1, 1984, 89-94.

Hastings, A., "Are Computer Architects to Blame for the State of Security Today?", https://www.sigarch.org/are-computer-architects-to-blame-for-the-state-of-security-today/, downloaded Mar. 1, 2021, 2019.

He, H., et al., "Self-mixing demodulation for coherent phase-sensitive OTDR System", Sensors, vol. 16, No. 5, 2016, 1-10.

He, H., et al., "Self-mixing demodulation for coherent phase-sensitive OTDR system", Sensors, vol. 16, No. 5, 2016, 681-690.

Henson, M., et al., "Memory encryption: A survey of existing techniques", ACM Computering Surveys (CSUR), vol. 46, No. 4, 2014, 53.

Herder, C., et al., "Physical unclonable functions and applications: A tutorial", Proc. IEEE, vol. 102, No. 8, Aug. 2014, 1126-1141.

Herder, C., et al., "Physical unclonable functions and applications: A tutorial", Proceedings of the IEEE, vol. 102, No. 8, 2014, 1126-1141.

Hill, K. O., et al., "Fiber Bragg grating technology fundamentals and overview", J. Light. Technol., vol. 15, No. 8, 1997, 1263-1276.

Hiinaga, S., et al., "Thermal effects on pcb laminate material dielectric constant and dissipation factor", IPC APEX EXPO, 2010.

Hu, Z., et al., "Improving spatial Resolution of Chaos OTDR Using Significant-Bit Correlation Detection", IEEE Photonics Technol. Lett., vol. 31, No. 13, 2019, 1029-1032.

Jain, A. K., et al., "IEEE Trans. Circuits Syst. Video Technol.", vol. 14, No. 1, Jan. 2004, 4-20.

Jia, S., "Doubling up on Fiber Capacity: A Winning Strategy for Full Duplex Coherent Optics", https://www.cablelabs.com/blog/doubling-fiber-capacity-winning-strategy-full-duplex-coherent-optics, Downloaded May 23, 2022, Mar. 8, 2018.

Jupiter Instruments, "I2C bus monitor", http://www.jupiter.com/, downloaded Mar. 1, 2021.

Kaplan, D., et al., "AMD Memory Encryption", White Paper, http://amd-dev.wpengine.netdna-cdn.com/wordpress/media/2013/12/AMD_Memory_Encryption_Whitepaper_v7-Public.pdf, Apr. 21, 2016.

Kim, Y., et al., "Analyzing OTDR Measurement Data Using the Kalman Filter", IEEE Trans. Instrum. Meas., vol. 57, No. 5, 2008, 947-951.

Kim, J. S., et al., "The DRAM latency PUF: Quickly evaluating physical unclonable functions by exploiting the latency-reliability tradeoff in modern commodity DRAM Devices", 2018 IEEE International Symposium on High Performance Computer Architecture (HPCA), IEEE, 2018, 194-207.

Kiriansky, V., et al., "DAWG: A defense against cache timing attacks in speculative execution processors", 2018 51st Annual IEEE/ACM International Symposium on Microarchitecture (Micro), IEEE, 2018, 974-987.

Kleberger, P., et al., "Security aspects of the in-vehicle network in the connected car", IEEE Intelligent Vehicles Symposium Proceedings, IEEE, 2011, 528-533.

Kocher, P., et al., "Spectre attacks: Exploiting speculative execution", 2019 IEEE Symposium on Security and Privacy (SP), IEEE, 2019, 1-19.

Koyamada, Y., et al., "Fiber-optic distributed strain and temperature sensing with very high measurand resolution over long range using coherent OTDR", J. Light. Technol., vol. 27, No. 9, 2009, 1142-1146.

Kuznia, C., et al., "Novel high-resolution OTDR technology for multi-Gbps transceivers", OFR 2014, Optical Society of America, 2014, 1-3.

Laferriere, S. W.J., et al., "Reference Guide to Fiber Optic Testing, Second Edition, vol. 1", JDS Uniphase Corporation, 2011.

Lalam, N., et al., "Performance Improvement of Brillouin Ring Laser Based BOTDR System Employing a Wavelength Diversity Technique", J. Light. Technol., vol. 36, No. 4, 2018, 1084-1090.

Lee, D., et al., "A 16ps-resolution random equivalent sampling circuit for tdr utilizing a vernier time delay generation", 2003 IEEE Nuclear Science Symposium Conference Record (IEEE Cat. No. 03CH37515), vol. 2, IEEE, 2003, 1219-1223.

Lee, D., et al., "Optimization of SNR Improvement in the Noncoherent OTDR Based on Simplex Codes", J. Light. Technol., vol. 24, No. 1, 2006, 322.

Lee, D., et al., "SNR enhancmenet of OTDR using biorthogonal codes and generalized inverses", IEEE Photonics Technol. Lett., vol. 17. No. 1, 2005, 163-165.

Li, Q., et al., "High Spatial Resolutation BOTDR Based on Differential Brillouin spectrum Technique", IEEE Photonics Technol. Lett., vol. 28, No. 14, 2016, 1493-1496.

Lie, D., et al., "Architectural support for copy and tamper resistant software", Acm Sigplan Notices, vol. 35, No. 11, 2000, 168-177.

Liehr, S., et al., "Wavelength-scanning coherent OTDR for dynamic high strain resolution sensing", Opt. Express, vol. 26, No. 8, 2018, 10573.

Lipp, M., et al., "Meltdown: Reading kernel memory from use space", 27th {USENIX} Security Symposium ({USENIX} Security 18), 2018, 973-990.

Liu, Y., et al., "Raman distributed temperature sensor with high spatial and temperature resolution using optimized graded-index few-mode fiber over 25 km-long distance", Paper, 26th Annual Conference on Optical Fiber Sensors, Sep. 24-28, 2018, Lausanne, Switzerland, 2018.

Liu, X., et al., "When good becomes evil: Keystroke inference with smartwatch", Proceedings of the 22nd ACM SIGSAC Conference on Computer and Co9mmunications Security, ACM, 2015, 1273-1285.

Lu, P., et al., "Distributed optical fiber sensing: Review and perspective", Appl. Phys. Rev., vol. 6, No. 4, 2019.

Lunainc, "Optical Backscattering Reflectometry (OBR)—Overview and Applications", Whitepaper downloaded from Lunainc.com, Aug. 17, 2018.

Lunglmay, M., et al., "Linearized Bregman Iterations for Automatic Optical Fiber Fault Analysis", IEEE Trans. Instrum. Meas., vol. 68, No. 10, 2019, 3699-3711.

Maas, M., et al., "Phantom: Practical oblivious computation in a secure processor", Proceedings of the 2013 ACM SIGSAC Conference on Computer & Communications Security, ACM, 2013, 311-324.

Manich, S., et al., "Detection of probing attempts in secure ics", 2012 IEEE International Symposium on Hardware-Oriented Security and Trust, IEEE, 2012, 134-139.

Maricevic, Z. A., et al., "Timedomain measurements with Hewlett-Packard network analyzer HP 8510 using the matrix pencil method", IEEE Trans. Microw. Theory Techn., vol. 39, No. 3, Mar. 1991, 538-547.

Mauldin, T., et al., "Minimal Overhead Optical Time-domain Reflectometer Via I/O Integrated Data Converter Enabled by Field Programmable Voltage Offset", The International Conference on Field-Programmable Logic and Applications, IEEE, 2021, 160-166.

Maxim Integrated, "DS3645: 4KB Secure Memory with Tamper Protecton for Network Server Applications", https://www.

(56) References Cited

OTHER PUBLICATIONS maximintegrated.com/en/products/embedded-security/security-managers/DS3645.html, downloaded Mar. 1, 2021.
McKeen, F., et al., "Innovative instructions and software model for isolated execution", Hasp (R) isca, vol. 10, No. 1, 2013.
Meijer, C., et al., "Self-encrypting deception: weaknesses in the encryption of solid state drives", 2019 IEEE Symposium on Security and Privacy (SP), IEEE, 2019, 72-87.
Messerges, T. S., et al., "Examining smart-card security under the threat of power analysis attacks", IEEE Transactions on Computers, vol. 51, No. 5, 2002, 541-552.
Moghadas, S. H., et al., "ROPAD: A Fully Digital Predictive Ring Oscillator Probing Attempt Detector", 2020 57th ACM/IEEE Design Automation Conference, 2020, 1-6.
Muanenda, Y., "Recent Advances in Distributed Acoustic Sensing Based on Phase-Sensitive Optical Time Domain Reflectometry", J. Sensors, vol. 2018, 2018.
Nakazawa, M., "Rayleigh Backscattering Theory for Single-Mode Optical Fibers", J. Opt. Soc. Am., vol. 73, No. 9, 1983, 1175-1180.
Naraghi, S., "Time-Based Analog in Digital Converters", PH.D. Dissertation, University of Michigan, 2009.
Oksman, A., "A Method for Detecting DRAM Bus Tampering", Thesis, Aalto University, Espoo, Finland, 2020.
Optical Zonu Corporation, "iSFC(R) Micro-OTDR Transceiver Series Fast Fiber Fault Finder(TM) Product Specification Sheet", Optical Zonu Corporation, 2014.
Paley, S., et al., "Active protection against pcb physical tampering", 2016 17th International Symposium on Quality Electronic Design (ISQED), IEEE, 2016, 356-361.
Park, B., et al., "A metal-via resistance based physically unclonable function with 1.18% native instability", 2019 IEEE Custom Integrated Circuits Conference (CICC), IEEE, 2019, 1-4.
Park, N., et al., "Coded optical time domain reflectometry: principle and applications", Passive Components Fiber-Based Devices IV, Proc. of SPIE, edited by Li, Ming-Jun, et al., vol. 6781, 2007, 678129-1-12.
Parkin, N., et al., "Gigabit SFP transceiver with integrated optical time domain reflectometer for ethernet access services", 39th European Conference and Exhibition on Optical Communications (ECOC 2013), 2013, 1-3.
Pastor-Graells, J., et al., "Single-shot distributed temperature and strain tracking using direct detection phase-sensitive OTDR with chirped pulses", Opt. Express, vol. 24, No. 12, 2016, 13121-13133.
Pearson, Chris, "Clock Skew in Large Multi-GHz Clock Trees", Analog Dialogue 53-01, 2019.
Purisima, M. C.L., et al., "Fpga implementation of a time domain reflectometry (tdr) system for slope monitoring applications", TENCON 2010-2010 IEEE Region 10 Conference, 2010, 1198-1202.
Quisquater, J. J., et al., "Electromagnetic analysis (ema): Measures and counter-measures for smart cards", International Conference on Research in Smart Cards, Springer, 2001, 200-210.
Raguram, R., et al., "iSpy: automatic reconstruction of typed input from compromising reflections", Proceedings of the 18th ACM Conference on Computer and Communications Security, ACM, 2011, 527-536.
Oksman, Aapo, "A Method for Detecting DRAM Bus Tampering", Espoo, Dec. 31, 2019, 86 pages.

* cited by examiner

BUS AUTHENTICATION AND ANTI-PROBING ARCHITECTURE

CROSS-REFERENCE TO RELATED APPLICATIONS

This application claims priority to and the benefit of the filing of U.S. Provisional Patent Application No. 62/967,786, entitled "DIVOT (Detecting Impedance Variations of Transmission Lines): A Novel Architecture Extending Hardware Trusted Computing Base Off CPU Chips and Beyond", filed on Jan. 30, 2020, the entirety of which is incorporated herein by reference.

STATEMENT REGARDING FEDERALLY SPONSORED RESEARCH OR DEVELOPMENT

This invention was made with government support under contract numbers CCF1439011 and CCF1421823 awarded by the National Science Foundation. The government has certain rights in the invention.

BACKGROUND OF THE INVENTION

Field of the Invention (Technical Field)

The present invention is related to providing security on interconnecting buses between computer chips, enabling authentication of memory buses, memory modules, and processor chips with little additional hardware and no performance overhead.

Background Art

Note that the following discussion may refer to a number of publications and references. Discussion of such publications herein is given for more complete background of the scientific principles and is not to be construed as an admission that such publications are prior art for patentability determination purposes.

Security in computer design is of paramount importance in today's digital era when financial, health care, governmental, and all other business applications rely on computers. No matter whether it is a high-performance server or an embedded computer in a smart phone, they all face great security challenges. A high-performance server at a data center providing cloud services may be vulnerable to physical attacks, such as probing the memory bus or a cold boot attack. This has been the major factor limiting the wide adoption of cloud computing services. Physical attacks on mobile computing devices and the internet of things (IoTs) are even easier than servers because adversaries can easily gain physical access to private and secure information stored in edge device memory and storage. Therefore, designing a secure computer architecture is very important.

Because of its importance, there has been extensive research reported in the literature on secure computing architectures. While these secure architectures provide adequate solutions to software attacks such as malicious OS, out-of-order execution, cache timing side channels, and so forth, they have limitations on protecting physical attacks such as probing and tampering on memory buses and memory modules. Memory encryption and Oblivious RAM (ORAM) protect data stored in off-chip dynamic random access memory (DRAM) from physical attacks. These approaches generally incur substantial performance overheads that can be reduced to some extent by many interesting techniques. However, any encryption requires a secure key that itself is subject to attacks. As new techniques are being proposed, designs for security get better but so do adversary's skills. Although extensively studied, no provably tamper-proof system exists. The IBM 4765 Secure Coprocessor shields an entire computer in a tamper-resistant enclosure that includes hardware that deters attacks, such as a Faraday cage and an array of sensors. Although this provides good security properties against physical attacks, it is prohibitively expensive.

SUMMARY OF THE INVENTION
(DISCLOSURE OF THE INVENTION)

An embodiment of the present invention is a time domain reflectometer circuit for detecting an impedance change in a transmission line, the circuit comprising a comparator comprising a positive input connected to an input of the transmission line and a negative input connected to a circuit for generating a modulation signal and a sampling clock. The circuit preferably does not comprise a multibit analog to digital convertor or a sample and hold circuit. The modulation signal preferably comprises a quasi-triangular waveform. The circuit for generating the modulation signal preferably comprises a resistor-capacitor circuit. The frequency of the sampling clock and the frequency of the modulation signal are preferably relatively prime. The circuit preferably further comprises a phase lock loop for stepping a phase of the sampling clock relative to a phase of a data transmission clock. The circuit preferably further comprises a coupler disposed between the transmission line input and the positive input of the comparator. The circuit is preferably embedded in a computer chip, which optionally comprises a central processing unit (CPU) chip or a memory chip. Any of the aforesaid elements or features may be combined with one or more of the other aforesaid elements or features, in any combination.

Another embodiment of the present invention is a method of detecting an impedance change in a transmission line, the method comprising embedding a time domain reflectometer (TDR) circuit in a computer chip, the TDR circuit comprising a comparator; transmitting a test signal through the transmission line; a positive input of the comparator receiving a back reflection voltage waveform from an input of the transmission line; a negative input of the comparator receiving a modulation signal; the comparator producing a probability density function; changing a phase of a TDR circuit sampling clock relative to a phase of a data transmission clock; calculating a reference impedance inhomogeneity pattern (IIP) of the transmission line; repeating the receiving, producing, and changing steps using a communication signal transmitted through the transmission line to calculate an operational IIP; and comparing the operational IIP to the reference IIP. The modulation signal preferably comprises a quasi-triangle waveform. The changing step is preferably performed using a phase lock loop (PLL). The computer chip optionally comprises a central processing unit (CPU) chip or a memory chip. The repeating and comparing steps are preferably performed within 50 μs. The method is preferably performed with a probability of detecting an impedance change of approximately 1 with an equal error rate of less than approximately 0.06%. The method preferably does not interfere with data transfer through the transmission line. The method is preferably performed without using a multibit analog to digital converter or a sample and hold circuit. Any of the aforesaid steps, elements or features may be combined with one or more of the other aforesaid steps, elements or features, in any combination.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate the practice of embodiments of the present invention and, together with the description, serve to explain the principles of the invention. The drawings are only for the purpose of illustrating certain embodiments of the invention and are not to be construed as limiting the invention. In the drawings:

FIG. 7A shows the measured distribution of the normalized similarity function $S_{xy}$ of same Tx-lines (Genuine) and different Tx-lines (Impostor). The magnified figure shows the clear separation of the two results. FIG. 7B shows measured receiver operating characteristics (ROC) of an integrated time domain reflectometer (iTDR). The magnified box shows that false positive rates are below 0.0006, indicating high authentication accuracy.

DETAILED DESCRIPTION OF EMBODIMENTS OF THE INVENTION

Figure 1:
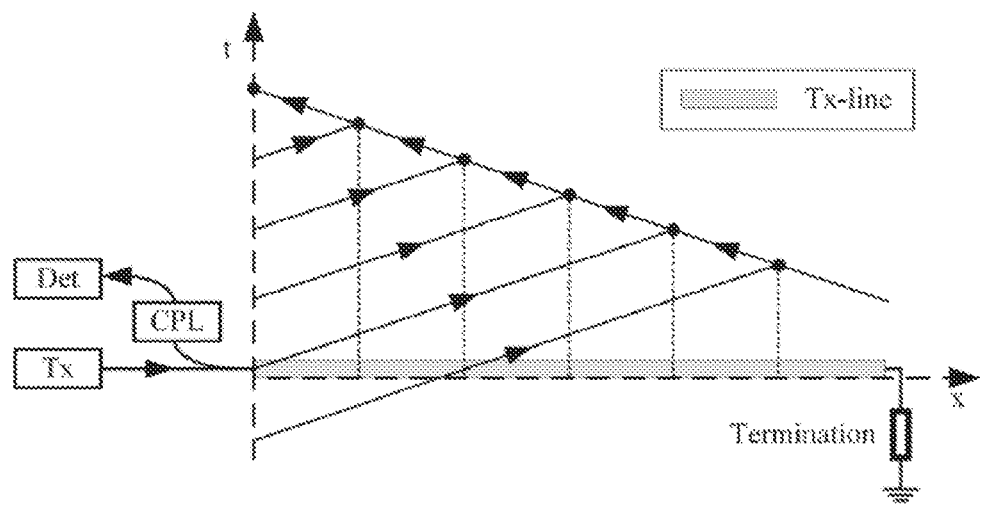
FIG. 1 is a schematic of a generic time domain reflectometer (TDR).

Tamper-proof hardware designs present a great challenge to computer architects. Most existing research limits hardware trusted computing base (TCB) to a central processing unit (CPU) chip; anything off the CPU chip is vulnerable to probing and tampering. Embodiments of the present invention are hardware designs and methods that provide strong defenses against physical attacks on interconnecting buses between computer chips or integrated circuits in a computer system, such as on external memory buses and memory modules. It is based on two-way physical authentication of a memory bus interconnecting a CPU and a memory module (such as dynamic random access memory, DRAM, or non-volatile random access memory, NVRAM), thereby extending the hardware TCB beyond CPU chips. The new approach is referred to as DIVOT: Detecting Impedance Variations Of Transmission lines. Every transmission line (Tx-line) in a computer system, such as a bus or interconnection wire, has a unique, intrinsic, and fingerprint-like property, its Impedance Inhomogeneity Pattern (IIP), i.e. the impedance distribution over distance. The non-uniformity of both material and geometry of a Tx-line makes the impedance change with distance, providing a unique IIP qualified as a physical unclonable function. The unpredictable, uncontrollable, and non-reproducible IIP fingerprints can be used to authenticate a Tx-line to ensure the confidentiality and integrity of data being transmitted. In addition, physical probes perturb the electromagnetic (EM) field around a Tx-line, leading to an altered IIP. As a result, runtime monitoring of IIPs can also be used to actively detect physical probing, snooping, and wire-tapping on buses, including the location of such tampering on the bus.

The DIVOT approach of the present invention uses the backscattered signals from already-existing digital waveforms flowing on a bus, and extracts the IIP without affecting normal data transfer. In other words, DIVOT is transparent to normal operations. Furthermore, DIVOT can fight against EM-based non-contact probes using a simple integrated circuit at a bus interface. In addition, since over 90% of the hardware in a DIVOT detector can be shared/multiplexed by many detectors on a chip, it can scale cost-effectively to include multiple buses in a complex SoC or CPU. The iTDR logic of the present invention can authenticate both master and slave of a bus for all memory access operations. At the same time, physical tampering can be detected instantly using the same iTDR logic.

The DIVOT system of the present invention preferably comprises an integrated time domain reflectometer (iTDR) that can preferably carry out in-situ and runtime monitoring of a Tx-line without interfering with normal data transfer, unlike a separate vector network analyzer or other external time domain reflectometer. As a signal (address, data, control, or clock) propagates along a Tx-line, the nonuniform impedance causes weak back-reflection waveforms intermingled with noise, governed by the EM principles. The backward propagating wave contains all the information of the IIP that is collected by the iTDR. By incorporating the iTDR circuit at the interface logic of a chip connected to a bus, the concurrent two-way authentication is possible while data transfer is in progress. The iTDR preferably utilizes analog-to-probability conversion (APC) and probability density modulation (PDM), described in more detail below and in Mauldin et al., "Integrated optical time-domain reflectometer with low overhead", *Applied Optics* vol. 59 No. 18, 20 Jun. 2020, pp. 5473-5480, incorporated herein by reference. These can be simply implemented around a 1-bit comparator (i.e. digital input), without the use of a conventional high-resolution analog-to-digital converter (ADC). Equivalent time sampling (ETS) is preferably used to remove the need for a high real-time sampling rate, which significantly simplifies hardware design and minimizes overhead without compromising the performance in comparison with a high-end TDR. The ITDR preferably performs runtime IIP measurements noninvasively and is preferably CMOS-compatible, allowing it to be integrated with any interface logic connected to a bus.

Embodiments of the present invention are generic, scalable, cost-effective, and low-overhead (in terms of footprint, logic resources, power consumption, and latency) security solutions for any computer system from servers to embedded computers in smart mobile devices and internet of things (IoTs). To demonstrate the proposed architecture, a working prototype of DIVOT has been built on a field programmable gate array (FPGA) incorporated into an off-chip memory bus. The prototype design consumes only 71 registers and 124 LUTs, indicating low hardware overhead. Most of these logic resources can be shared by different iTDRs, protecting multiple buses in a parallel fashion. This further reduces the overhead per iTDR, making DIVOT easily scalable to large and complex systems. Experimental results show that both authentication and tamper detection can be completed within 50 µs (i.e. within memory operation time frame), and the probability of correctly identifying a bus is close to 1 with an equal error rate (EER) of less than 0.06% at room temperature, protecting against physical attacks including Trojan chip, wire-tapping, hardware probing/snooping, tampering, and cold boot attacks, all of which cause a change in the IIP.

FIG. 1 illustrates how a typical TDR (time domain reflectometer) machine works. A probe signal is launched by a transmitter (Tx), and propagates down the line. Any impedance discontinuity on the Tx-line produces a back-reflection, which can be collected by a detector (Det) through a coupler (CPL). A reflection can be considered as a scaled and phase shifted version of the probe signal. Therefore, as shown in FIG. 1, the total voltage received at the Det is a linear combination of many reflections, contributed by discontinuities along the Tx-line. Consequently, each Tx-line system can be abstracted as a linear time-invariant (LTI) system whose impulse response or transfer function is determined by its IIP. Theoretically, by sending an ideal impulse signal into a Tx-line, one can resolve the transfer function and the IIP of the Tx-line. This concept is widely used in industry to characterize high-speed electronic components. Conventional TDR machines provide high spatial and voltage resolution, by means of high-end ADCs. Such high-end ADCs are very bulky, and thus not as preferable for use with the present invention. The IIP is a result of non-uniformity of a Tx-line, and it is typically small. In fact, the collected reflection signal is typically so weak that its SNR (signal to noise ratio) is possibly smaller than 1, meaning that the signal is below noise floor. However, in order to measure the IIP with sufficient accuracy, both high voltage resolution and high SNR are required. An ideal ADC with infinitely high resolution cannot perform the measurement, not to mention its complexity and bulky footprint.

Analog-to-Probability Conversion (APC

Figure 2:
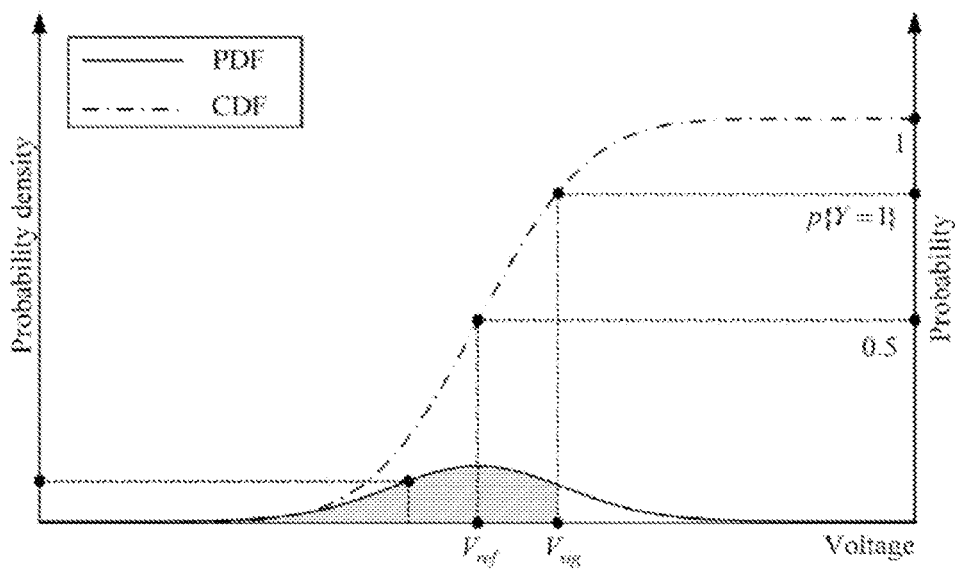
FIG. 2 shows the white Gaussian noise distribution in typical electronic systems.

Instead of such a conventional ADC, embodiments of the present invention use APC, where a comparator and a counter are preferably utilized to perform IIP measurements with high voltage resolution and equivalently high SNR. A comparator has a non-inverted/positive input and an inverted/negative input, also referred to as the reference input. The output is a Boolean variable, Y, that has a value of 1 if the voltage on the positive input $V_{sig}$ is higher than the incident on the reference input, $V_{ref}$. Assuming an ideal constant $V_{ref}$ and a constant input $V_{sig}$, the output Y is always a constant (0 or 1). However, in reality, electronics are noisy, making Y a random variable rather than a constant. The probability of Y=1 is expressed in Eq. (1):

$$p\{Y=1\}=p\{V_{sig}-V_{ref}>V_{noise}\} \quad (1)$$

where $V_{noise}$ represents the total amount of noises that propagate and contribute to the comparator's reference input. In electronics, thermal noise dominates at higher frequencies, thus $V_{noise}$ presented on the comparator's reference input follows a Gaussian distribution. FIG. 2 plots the Gaussian noise distribution around $V_{ref}=0$. Essentially, this distribution is a probability density function (PDF). The corresponding cumulative distribution function (CDF) is also plotted in FIG. 2. This clearly shows that a 1-to-1 relation between analog voltage $V_{sig}$ and probability p(Y=1) exists, making APC possible. We can write:

$$V_{sig}=V_{ref}+CDF^{-1}(p\{Y=1\}) \quad (2)$$

where $CDF^{-1}( )$ is the inverse CDF. In an iTDR, the back reflection signal is fed to the comparator's positive input. Let the input voltage waveform be $V_{sig}(t)$, which in essence is the IIP of a Tx-line. Let the corresponding probability of Y=1 as a function of time over this waveform be $P\{Y=1\}(t)$. By repeatedly probing the Tx-line over a large number of times, $P\{Y=1\}(t)$ over the waveform is measured. $V_{sig}(t)$ can be calculated using Eq. (2), and the IIP of this Tx-line is obtained.

FIG. 2 also infers that the APC's sensitivity, defined as $$\frac{d}{dV_{sig}}p\{Y=1\} \quad (3)$$

is determined by the slope of the CDF, which is nothing but the PDF. According to probability theory, for a Gaussian variable, the PDF within 2 standard deviations (2σ) range is high, indicating that a high APC sensitivity can be achieved within this region. Also, in this region, its linearity holds significantly better than other regions. Therefore, APC is most effective within 2σ, implying that the iTDR should preferably use this range. Considering that the variance of Gaussian noise is also the energy of the noise, APC works well with high sensitivity in a linear region when signal-to-noise ratio (SNR) is equal to or smaller than 1. In other words, the energy of $V_{sig}$ should not exceed $\sigma^2$ to achieve a linear mapping between probability and voltage. This leads to a dynamic range of 2a. In order to increase the measurement dynamic range, probability density modulation (PDM) is preferably used.

The fundamental difference between the APC and oversampling-based and/or dithering-based super-resolution ADCs, such as a sigma-delta ADC, is that APC compares the instant input voltage with a varying reference voltage at each trigger repetitively, avoiding the very high sampling rate required by real-time super-resolution ADC. Therefore, APC doesn't require any sample and hold circuit, which minimizes the input capacitance and maintains a high input bandwidth. It is worth noting that comparators, used as digital inputs, have much larger analog bandwidth than typical super-resolution ADCs, making the use of APC advantageous for today's high-speed buses.

Probability Density Modulation (PDM)

Figure 3:
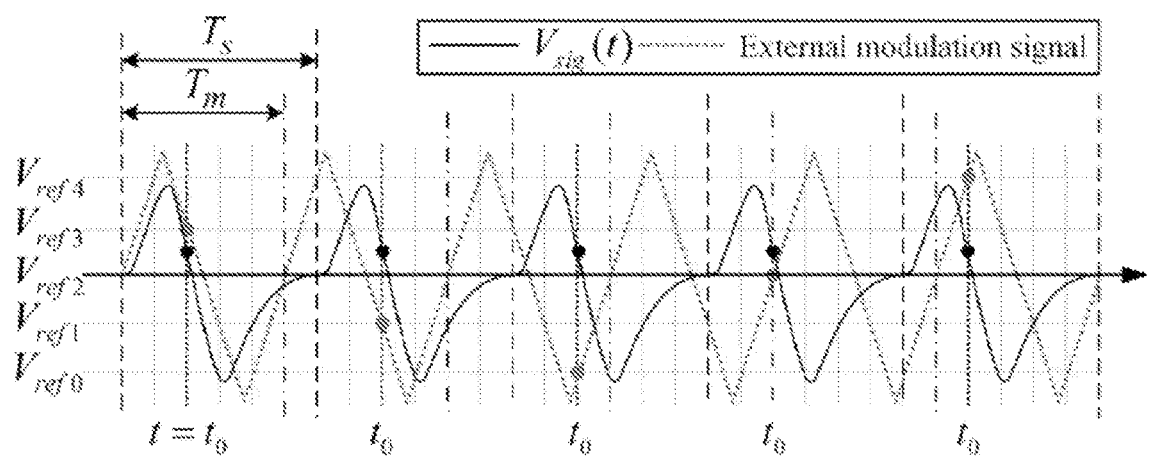
FIG. 3 illustrates a probability density modulation (PDM) scheme.

Although the APC method is theoretically effective, there remain practical challenges for APC to be used for DIVOT. The intensity of intrinsic noise of an IC is typically unpredictable, and it varies from chip to chip. Also, when the SNR is larger than 1, the APC falls into the non-linear region. To solve this problem, an external modulation signal is preferably connected to the reference input to rebuild the PDF in a controlled fashion. This approach, namely probability density modulation (PDM), successfully resolves the remaining issues. In a PDM scheme, an external modulation signal and intrinsic noise work together for APC to provide high-quality IIP measurements. Although the external modulation signal in a PDM scheme can use many different waveforms, and they can be generated by a wide variety of circuits, a simple triangle wave is preferably used. For example, a quasi-triangle waveform can be easily achieved using a digital output circuit and a simple resistor-capacitor (RC) charge-discharge circuit. The frequency of the triangle wave $f_m$, determined by the frequency of the digital output, and the frequency of the data/sampling clock $f_s$ must satisfy certain requirements to work properly. If $f_m=f_s$, the reflection signal will be compared with the same voltage in all measurements, completely removing the effectiveness of an external modulation signal. In order to compare a reflection signal with different reference voltages, $f_m$ and $f_s$ must be relatively prime, which provides Vernier time delay between the reflection signal and modulation signal. FIG. 3 demonstrates this concept, assuming $5f_m=6f_s$. The reflection waveform is repeated for 5 times. At a fixed time point ($t=t_0$) with respect to the starting point of a period, five discrete reference voltages ($V_{ref0}$ to $V_{ref4}$) are created over 5 waveform periods. Vernier oscillator theory has also been employed in time-to-digital converters (TDC) to achieve high temporal resolution.

Figure 4:
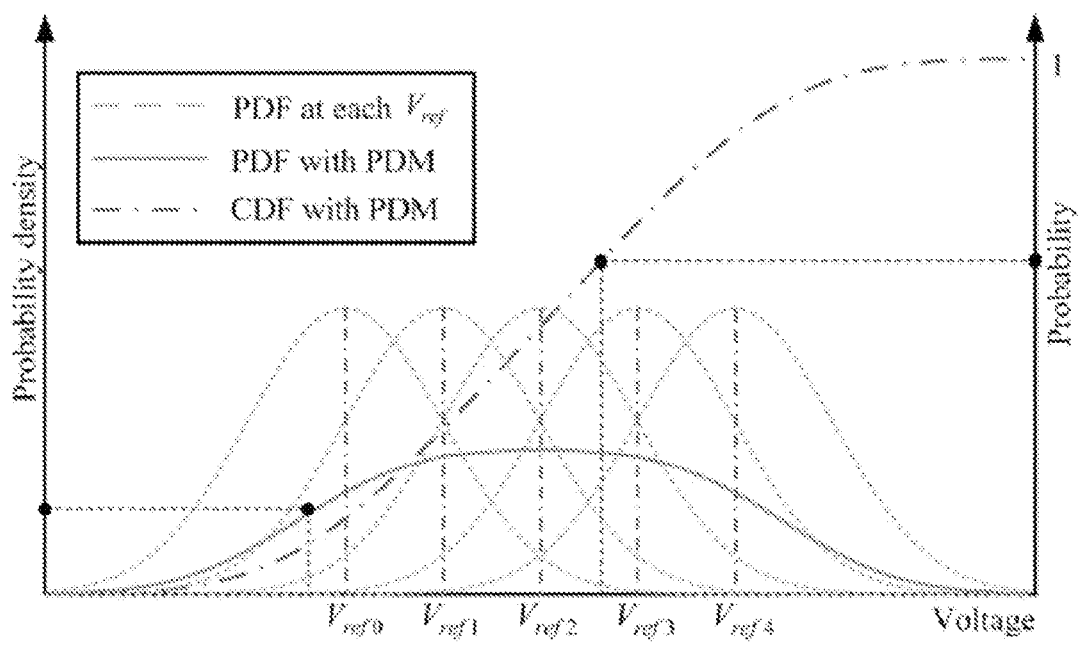
FIG. 4 show the probability density function (PDF) and cumulative distribution function (CDF) for the PDM scheme of FIG. 3.

FIG. 4 plots the associated PDF and CDF of this example. Five reference voltages are preferably introduced by the triangle wave. Each reference voltage appears evenly over time with a probability of 0.2. Therefore, the equivalent PDF is the normalized superposition of each PDF associated with each reference voltage level. The working mechanism is shown in FIG. 4, which clearly shows that the proposed PDM scheme effectively increases the linear region, leading to a much-widened measurement dynamic range in comparison with a single $V_{ref}$. Thus, by introducing an external modulation signal into APC, the CDF can be modified and better balanced in terms of sensitivity, linearity, and dynamic range as necessary. It is worth noting that the external modulation signal in a PDM scheme can be shared with all iTDRs inside a chip, significantly lowering overhead per iTDR.

Equivalent Time Sampling (ETS)

In a TDR system, high sampling rate is important, since it determines the spatial resolution, or the smallest resolvable distance in an IIP. Although possible, real-time sampling at an extremely high sampling rate (>10 GSa/sec) requires a very complex hardware design. The proven LTI property of this system indicates that the response for a given input preferably produces the same output, regardless of measurement time. Generally, digital signals have several states, represented by different voltage levels. For example, an NRZ communication protocol has two voltage levels representing a 1-bit value at a time; a PAM4 protocol has four voltage levels, representing a 2-bit value at a time. Fundamentally, any data waveform on a Tx-line is formed by switching between different voltage levels, thus correspondingly producing rising and falling edges. Considering that the interface circuits inside a digital chip are fixed, voltage switching remains consistent over time; i.e. the shapes of rising and falling edges are highly repeatable. Consequently, the back-reflections caused by these rising and falling edges are also consistent, allowing the use of equivalent time sampling (ETS) in the present invention, which preferably utilizes the rising or falling edges of data waveforms as the probe signal.

Figure 5A:
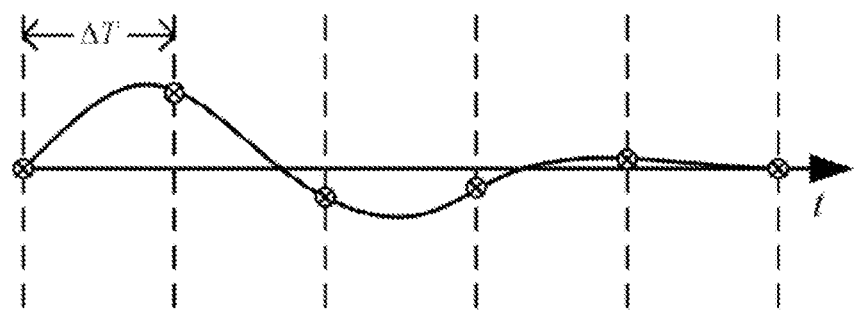
FIG. 5A is an illustration of real-time sampling.
Figure 5B:
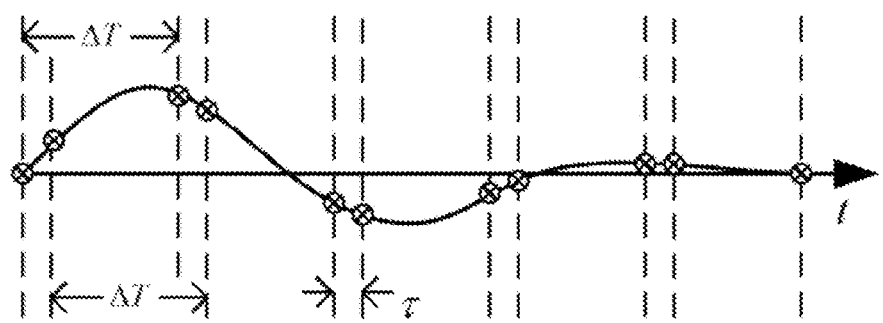
FIG. 5B is an illustration of equivalent time sampling (ETS) using a phase stepping function.

ETS has been used to equivalently boost the sampling rate in high resolution TDRs. In the present invention, ETS is preferably achieved by changing the phase relationship between the data transmission clock and the sampling clock of the iTDR. This is preferably achieved via a phase lock loop (PLL) with phase stepping function, where the output clock's phase can be stepped with respect to the input clock as requested. FIGS. 5A-B compare real-time sampling and ETS. FIG. 5A shows that a typical real-time sampling scheme performs measurements at discrete time points with a time interval of $\Delta T$, corresponding to a sampling rate of $1/\Delta T$. Assuming that total number of points in this measurement is N, the total length of the measurement is $N\Delta T$. In embodiments of the present invention, the iTDR preferably steps the phase of the sampling clock by a small increment, $\tau$, with respect to the transmission data clock after each measurement. Thus, after repeating the process over M times, where $M\tau=\Delta T$, shown in FIG. 5B, a total of M×N sampling points are achieved over the same data length $N\Delta T$. Thus, without increasing the real-time sampling rate $1/\Delta T$, the iTDR provides an equivalent sampling rate of $M/\Delta T$, or $1/\tau$. In this case, the sampling rate is determined by the smallest phase shift interval ($1/\tau$) rather than the period of the ADC's sampling clock ($\Delta T$).

The PLL in Xilinx Ultrascale+ series FPGA provides a dynamic phase shift of 11.16 ps, corresponding to an equivalent sampling rate greater than 80 GHz. The propagation velocity of an EM wave on a printed circuit board (PCB) Tx-line is about 15 cm/ns. Therefore, the spatial resolution is about 0.837 mm, which is sufficient for the present applications.

Usually, all bus interfaces in a computer chip share the same data transmission clock. Thus, one PLL with phase stepping function is sufficient to drive all iTDRs corresponding to different buses, regardless of the number of ports under protection.

Runtime Measurement Support

When the system is running, the data launched into a Tx-line is random. In this case, the probe signals do not happen at a fixed time point. In particular, most high-speed interfaces apply channel encoding to ensure that different symbols occur evenly. Therefore, in a serial communication channel, the number of rising edges approximately equals the number of falling edges and the waveforms of rising and falling edges are highly symmetric. As a result, the reflections of the rising and falling edges cancel each other, making the present invention unusable. This problem can be addressed by generating a sampling trigger signal from the data buffer, such as a first in first out (FIFO) buffer. For example, in a binary communication protocol, once a value 1 preceding a value 0 is ready to be launched into the Tx-line, the iTDR preferably generates a sampling trigger and passes it to the APC to take measurements. Fortunately, the sampling trigger signal is preferably not needed for the clock lane, since the clock waveform is highly consistent and predictable.

Figure 6:
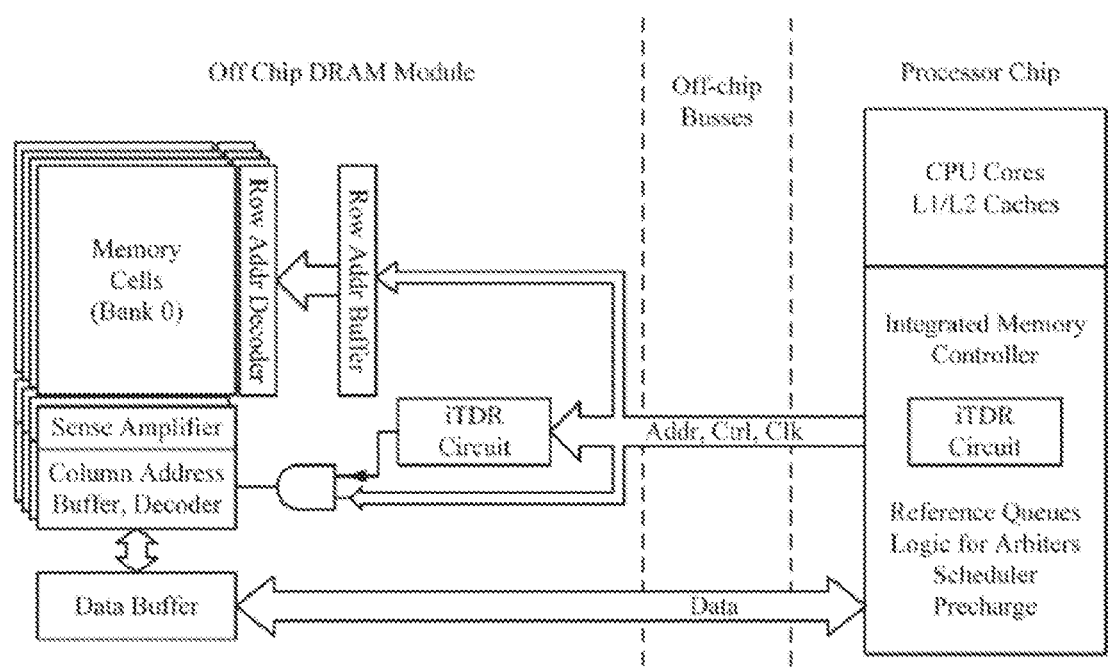
FIG. 6 is an exemplary design showing incorporation of DIVOT architecture of the present invention on a memory bus.

FIG. 6 shows an example design of incorporating DIVOT architecture in accordance with the present invention into a CPU chip and an off-chip synchronous dynamic random access memory (SDRAM) module. On the processor side, an iTDR circuit of the present invention is added to the integrated memory controller on the CPU chip, such as a double data rate (DDR) controller, preferably as an integral part of DRAM control logic working together with reference queue, arbiter, scheduler, refresh, and precharge logic. It is preferably directly connected to the external memory bus to receive and collect reflection waveforms while the CPU is accessing SDRAM. The major function of the iTDR is preferably to continuously monitor bus activities to (1) authenticate the SDRAM module (e.g. dual in-line memory module or DIMM cards) and the memory bus to ensure that they are indeed the hardware that the CPU recognizes, and (2) detect possible bus snooping or probing by any foreign hardware. On the SDRAM module side, the same or a similar iTDR circuit is preferably incorporated into the control logic of the memory module sitting aside the normal address decoding, sense amplifier, and buffering logic. It preferably starts sensing impedance signals on the bus as soon as the system is powered up. Since the clock starts as soon as the system is on irrespective of whether there is a memory operation or not, the iTDR preferably starts working to collect reflection waveforms on the clock lane. The output values of the iTDR are preferably stored in a FIFO buffer. When a memory operation starts, the iTDR continues collecting IIPs and updates the previously stored IIP values in the FIFO buffer preferably during precharge cycles (if a new row is accessed), activation cycles, and the row access cycles. The newly collected IIP fingerprint is preferably compared with the stored fingerprint (in a read-only memory or ROM, as explained below) for authentication purposes to ensure the memory access request is indeed coming from the CPU and the memory bus that was initialized. At the column access time, the column address is preferably gated by the authentication result so that only the authorized CPU chip and memory bus can access (read or write) the SDRAM. Tamper detection and blocking are also preferably performed at the same time.

The operation of computer systems equipped with the DIVOT circuit of the present invention preferably involves three major steps: calibration, monitoring, and reaction to counter attacks. The calibration process initializes the pairing of communicating chips connected to a bus, such as a CPU chip and memory modules that are accessed by the CPU. This step is preferably performed at the time of manufacture or user installation. During the calibration process, the iTDR on the processor chip preferably establishes the fingerprint (IIP) of the memory bus connected to the memory module that the processor will access. The IIP is obtained by collecting and calculating back reflections using the iTDR. Similarly, the iTDR on the memory side preferably collects the fingerprint of the bus connected to the processor. The fingerprint covers the entire Tx-line from the output of the iTDR on the CPU chip to the input of the iTDR on the memory side. After the fingerprint is collected, both the CPU and the memory module store the fingerprint, preferably in their respective erasable programmable read-only memories (EPROMs). The security of these EPROMs is not critical to this architecture, because even if attackers gained access to the IIP, they would not be able to use it once an IIP leaves the exact Tx-line.

Monitoring preferably is performed when the system is in operation. Both iTDR circuits keep receiving and collecting reflection signals to derive a fingerprint (IIP) of the transmission bus and compare it with the stored fingerprint in the ROM. If the newly collected fingerprint matches the one stored in the ROM, authentication is successful and normal computation proceeds. The processor wants to make sure that the memory module that it intends to read data from, or write data to, is indeed the memory module it recognizes. In this way, correctness, integrity, and confidentiality of the data are maintained. Detecting hardware probing and snooping is carried out at the same time. The memory module preferably compares the newly collected fingerprint with the one stored in its ROM in real time to ensure all data accesses, read or write, are indeed from the authorized processor chip. Any unauthorized attempt will be instantly blocked. This can effectively protect memory data from physical attacks, such as cold boot attacks, because any unauthorized data requests will be rejected no matter whether an attacker swaps the memory module to another computer or uses a Tx-line other than the bus connected to the authorized processor chip.

Reaction to counter attacks initiates as soon as an abnormal IIP signal is detected, whether it is an unauthorized communicating device, such as a different Tx-line or hardware module, or a physical tampering attempt. When the CPU finds a non-matching fingerprint, it indicates that the memory module might have been swapped. In this case, the CPU preferably responds by stopping normal memory operation until the newly collected fingerprint matches the one stored in the ROM again. In this way, it avoids reading incorrect, or replay, data and writing sensitive information to a wrong device. If abnormal IIPs are detected, indicating a possible bus tampering attempt, the CPU preferably performs necessary actions to protect sensitive information from leaking. Existing protection techniques can be applied for this purpose. On the memory side, the reaction is preferably simply blocking or disabling data operations in the memory once abnormal signals are detected.

Example

Figure 9A:
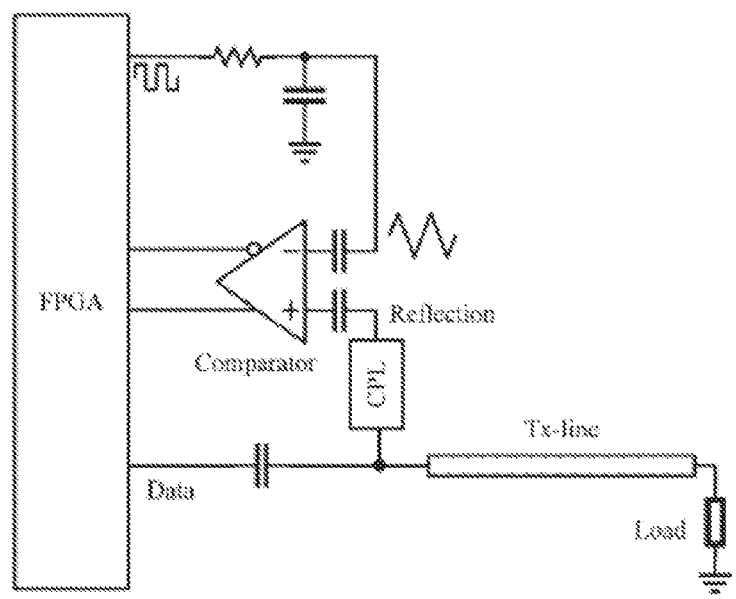
FIG. 9A shows an experimental setup to test detection of cold boot attacks and Trojan chips.

A prototype DIVOT system of the present invention was built on a 6-layer custom PCB and a Xilinx ZYNQ Ultrascale+ series FPGA evaluation board (ZCU104). The custom PCB comprised a comparator, a coupler, and a terminated Tx-line, while the FPGA board contained all of the logic components necessary to build a single-lane bus equipped with the DIVOT architecture. The custom PCB and evaluation board were connected via FPGA Mezzanine Card (FMC). The simplified schematic is shown in FIG. 9A. The data launched into the Tx-line from the FPGA was completely random to demonstrate the feasibility of runtime IIP monitoring on data buses. Six 25 cm PCB Tx-lines were used as devices under test to carry out the experiments. Considering the hardware limit, the data rate and APC clock rate were set to 156.25 MHz for stability and simplicity. According to the Xilinx Vivado Utilization Report, hardware resources used by the DIVOT circuit included one digital input, one digital output, 71 registers, and 124 LUTs (approximately 0.8% of available resources on the xczu7ev-ffvc1156-2-e FPGA chip), where 80% were used to generate counters.

Similarity ($S_{xy}$) is defined as the inner product between two IIP waveforms:

$$S_{xy} = \sum_{n=0}^{N-1} x(n) y(n) \quad (4)$$

where x and y are two different IIP waveforms, and n is the index in time/distance domain. Time and distance are linearly related by the propagation velocity divided by 2, where 2 accounts for round trip. $S_{xy}$ was normalized to have a value ranging from 0 to 1. Similarity can be readily used for authentication. For runtime tamper detection applications, the IIP error function ($E_{xy}$) is defined to quantify the difference between the normal IIP x(n) and tamper waveform y(n). The error function, $E_{xy}(n)$, is given by:

$$E_{xy}(n) = [x(n) - y(n)]^2 \quad (5)$$

A large error at a certain index, $n_0$, indicates that a tamper attack is present at the corresponding location.

Figure 7A:
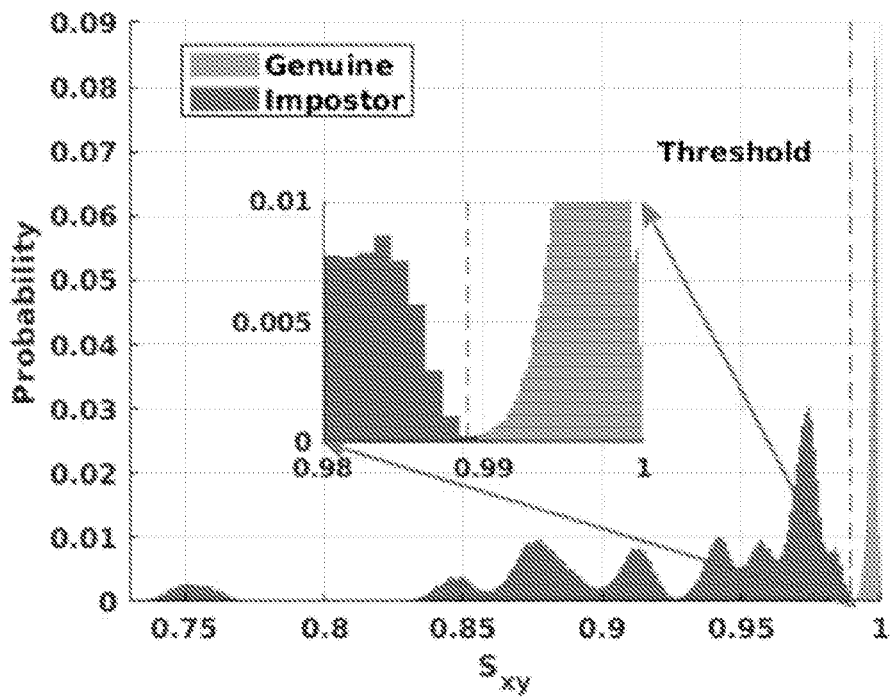
FIGS. 7A-B show measured Impedance Inhomogeneity Pattern (IIP) results over six Tx-lines using a DIVOT system of the present invention, obtained over 8,192 measurements.
Figure 7B:
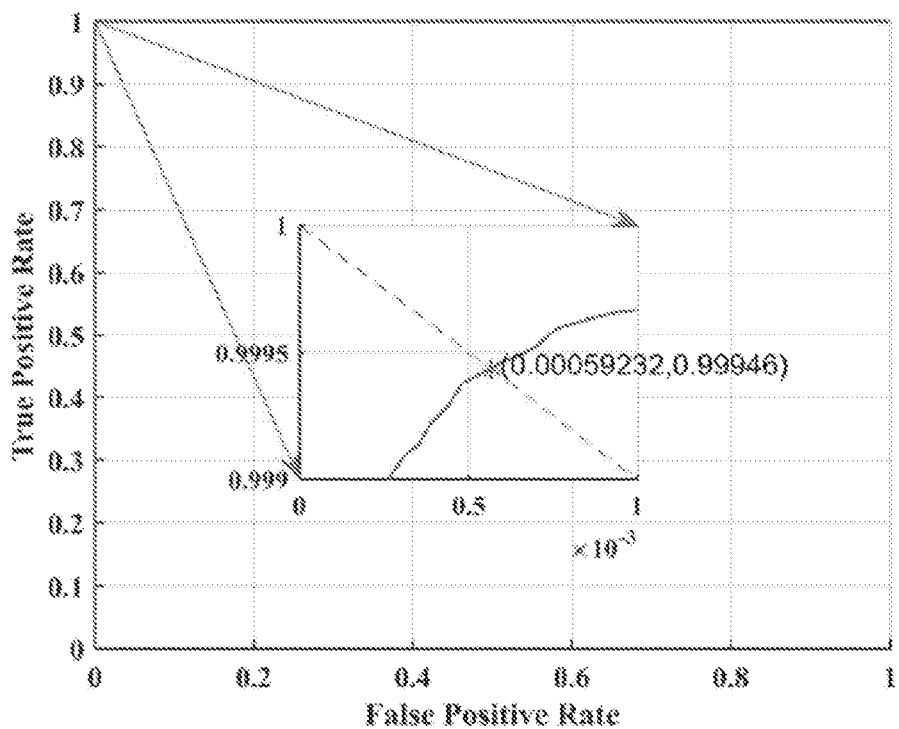

The first experiment was to demonstrate that the IIPs measured by the iTDR from the same Tx-line (Genuine) remain the same over time, while the IIPs from different Tx-lines (Impostor) differ greatly. For this purpose, six Tx-lines on the customized PCB were measured 8192 times each, giving rise to six groups of IIP data. Normalized similarity was calculated within each group and between different groups. Genuine and impostor distributions are plotted in FIG. 7A, and the corresponding receiver operating characteristic curve (ROC) is shown in FIG. 7B. As shown in FIG. 7A, the distribution of a genuine IIP is clearly separated from that of an impostor IIP. If a proper threshold value is chosen, two Tx-lines can be clearly differentiated. Thus the present invention can effectively authenticate a Tx-line. As shown in FIG. 7B, among the six Tx-lines measured over 8192 times, an EER of less than 0.06% was observed in this experiment. During the authentication process, a threshold value can be set to correctly identify a Tx-line with certainty. For example, if the newly measured IIP is equal to the IIP value stored in the ROM within ±0.1%, then it is authenticated. Otherwise, authentication fails.

Figure 8:
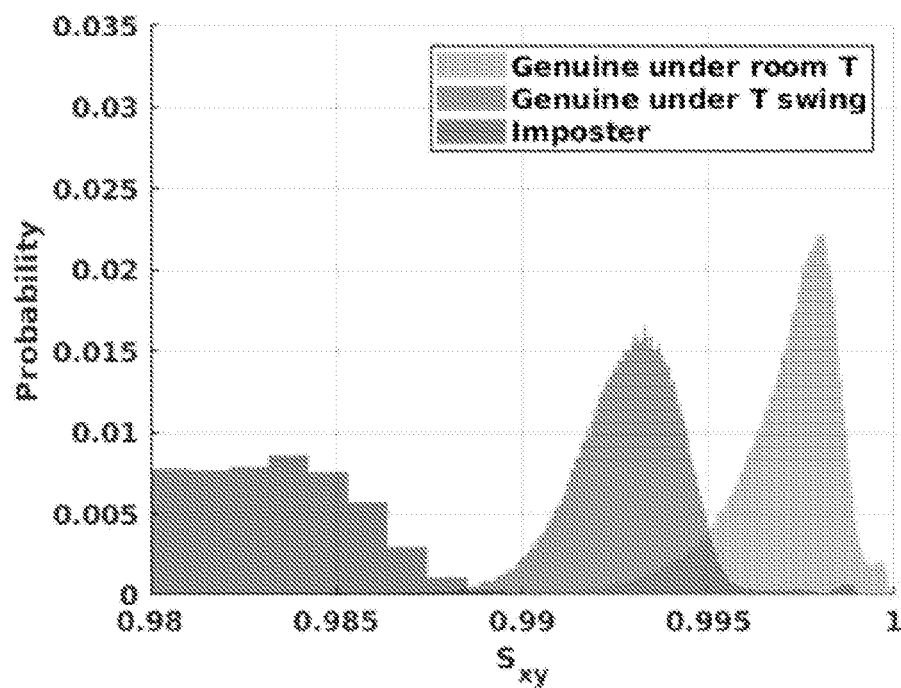
FIG. 8 shows the measured distribution of the normalized $S_{xy}$ with a temperature (T) swing from 23° C. to 75° C.

It is known that an increased temperature leads to an increased dielectric constant (Dk), or permittivity, in today's PCB laminates. An escalated Dk leads to a rise in line capacitance associated with a high-speed bus, resulting in a decreased local impedance. However, due to the fact that the impedance at any point along a bus changes in the same fashion as ambient temperature varies, the impedance contrast (IIP) is not expected to change significantly. To evaluate the influence of temperature, tests were conducted in an electric oven that varied in temperature from 23° C. to 75° C. The genuine distribution moved towards left, while the impostor distribution didn't change noticeably. This resulted in an increased EER of 0.14%. The comparison between genuine distribution at room temperature and genuine distribution at a varying temperature is shown in FIG. 8.

Vibration and acoustic waves may reduce the performance of bus authentication by affecting its IIP given that they can compress or stretch a bus. To evaluate the system under such conditions, a piezo-electric driver was attached to the board and a continuously chirped knocking frequency, ranging from 1 Hz to 50 Hz, was applied. Under this condition, the EER increased to 0.27%, a higher threshold value. Theoretical analysis suggests that monitoring multiple wires on a bus can exponentially increase authentication accuracy, which may be able to be used to reduce the EER.

Cross-talk or EM radiation from chips in close proximity to a bus may couple into the proposed DIVOT receiver and contribute to noise. However, since the IIP measurement is synchronized with waveforms flowing on the bus, the DIVOT receiver effectively removes the asynchronized electromagnetic interference (EMI) noise. To test whether or not this significantly reduces performance, a high-speed digital circuit was placed close to a bus, and the evaluation test showed that the EER stayed at 0.06%.

Detection of Trojan and Cold Boot Attacks

Load modification happens when an adversary replaces an original chip with a Trojan chip, or tries to carry out a cold boot attack. Whenever such an attack happens, the interface of the chip at the end of a bus on a PCB shows in an abrupt impedance change, leading to a large reflection peak at the load. Whether modifying or replacing the load, a change of IIP at the termination occurs, resulting in a large reflection peak, which can be easily detected by the DIVOT iTDR system of the present invention.

Figure 9B:
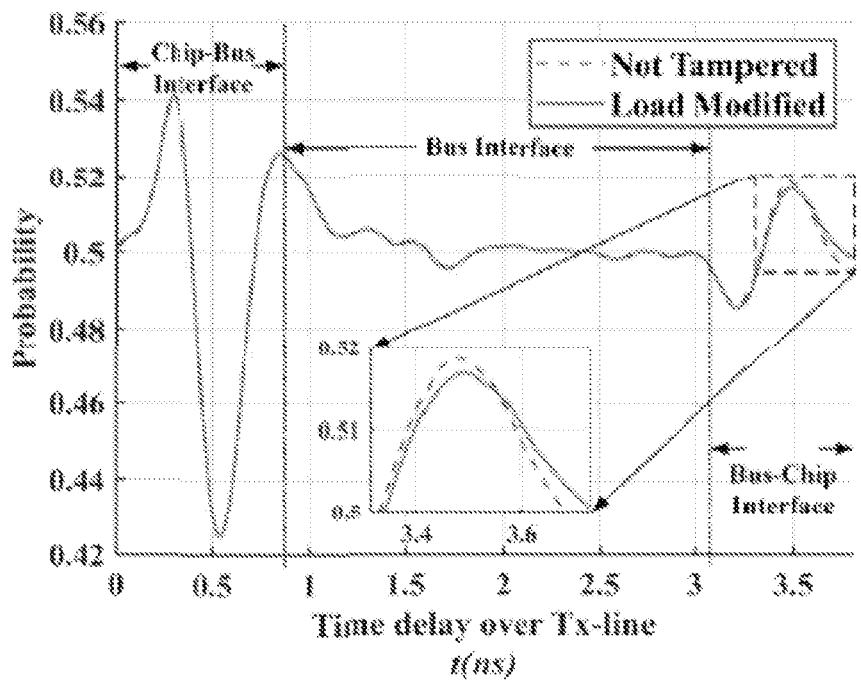
FIG. 9B shows a comparison of IIPs with and without load modification for the setup of FIG. 9A.
Figure 9C:
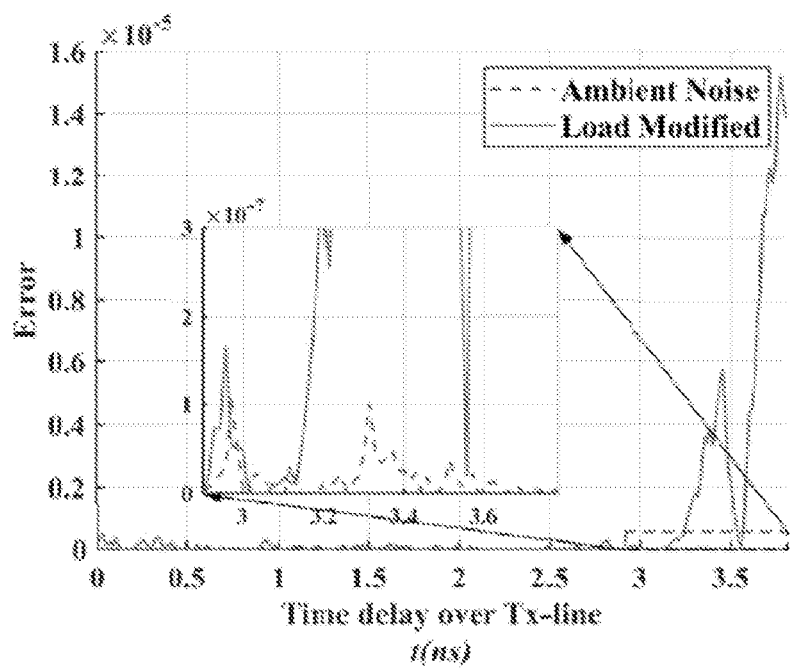
FIG. 9C shows a comparison of $E_{xy}(t)$ with and without load modification for the setup of FIG. 9A.

The receiver chip was replaced by a different chip (same model number), and the IIP waveform error function, $E_{xy}$. The result is shown in FIGS. 9B and 9C. FIG. 9B plots the IIP distribution as a function of signal propagation time over the Tx-line measured. The time range spans between 0 ns and 3.8 ns, representing the total time for the signal to propagate over the Tx-line from one end to the other and back. The dotted line in this figure shows the IIPs measured with no load modification, whereas the solid line represents the IIPs after the receiver chip is replaced. The IIP differs greatly when the chip is replaced at the other end (around the time point of 3.5 ns, as shown in the enlarged box in the figure). FIG. 9C shows the error function $E_{xy}$ over the same time range. The dotted line in this figure represents the error function of IIPs with no attack, represented by ambient noise, while the solid line represents the error function when the attack happens. The IIP waveform changes dramatically at the termination point where the chip is replaced. A very large peak of $E_{xy}$ was observed by the iTDR, indicating that an attack was made. These results demonstrated the feasibility of using DIVOT to protect against Trojan and cold boot attacks.

Detection of Wire-Tapping

Figure 9D:
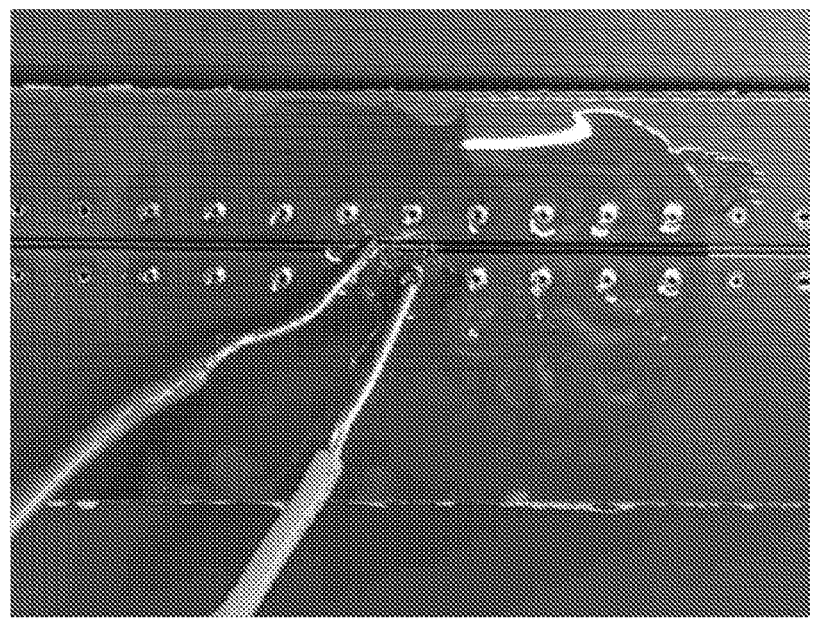
FIG. 9D shows an experimental setup to test detection of wire-tapping.
Figure 9E:
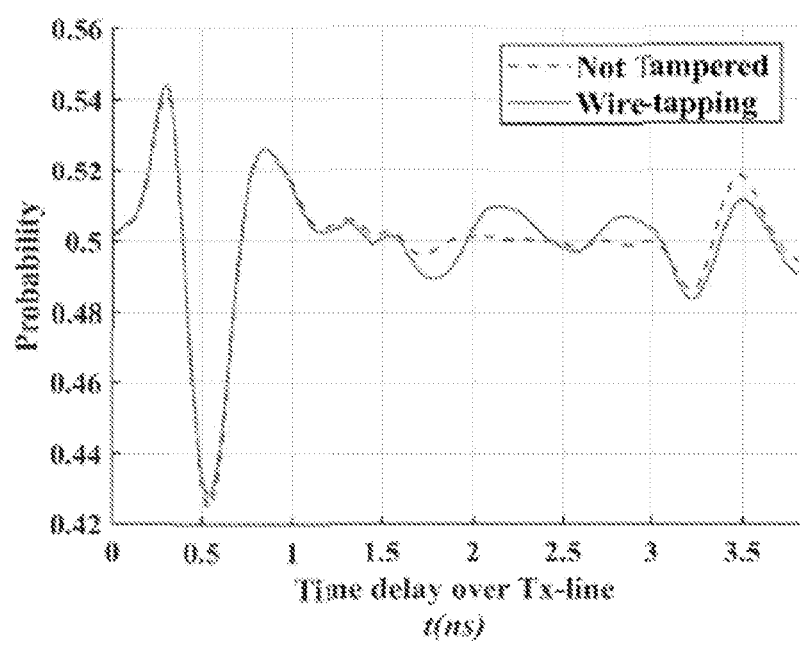
FIG. 9E shows a comparison of IIPs with and without wire-tapping.
Figure 9F:
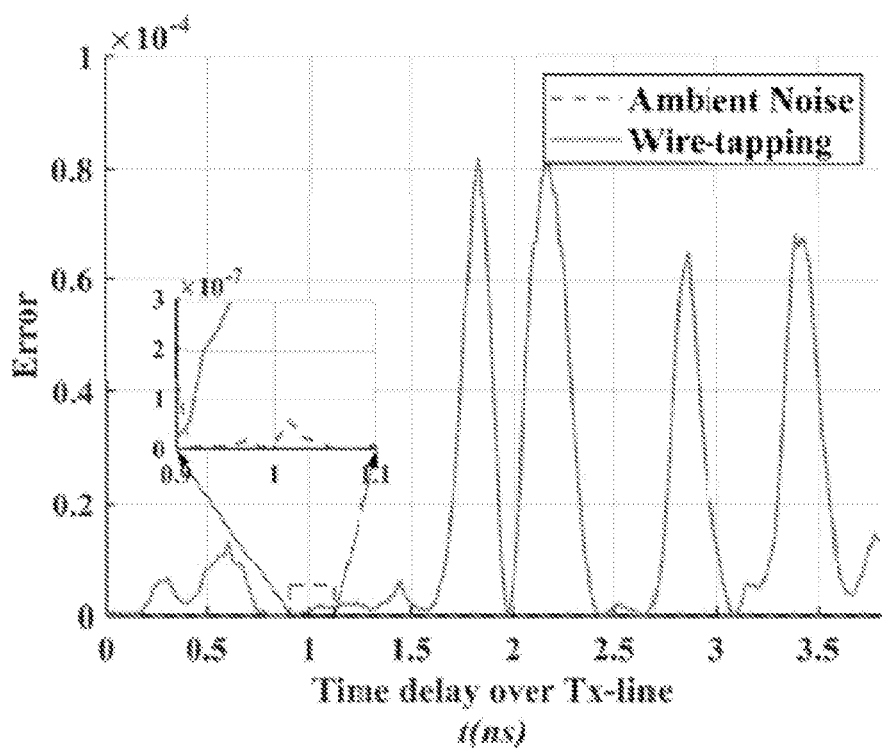
FIG. 9F shows a comparison of $E_{xy}(t)$ with and without wire-tapping.

Wire-tapping is one of the most invasive tampers because it dramatically changes the impedance of a Tx-line. As shown in FIG. 9D, the solder mask of a PCB Tx-line was scratched and a tapping-wire was soldered onto it, which was connected to an oscilloscope to emulate a wire-tapping attack. FIG. 9E shows the IIP waveforms before and after applying wire-tapping and FIG. 9F shows the $E_{xy}$ of two IIPs before and after applying wire-tapping. The solid line shows that the IIP change is very significant, and was easily detected using the DIVOT architecture of the present invention. Experiments also showed that wire-tapping is so invasive that even when the wire was removed, the remaining changes to IIP were still large, indicating that, in this case, the original IIP was permanently non-reversibly altered.

Detection of Magnetic Probing/Snooping

Figure 9G:
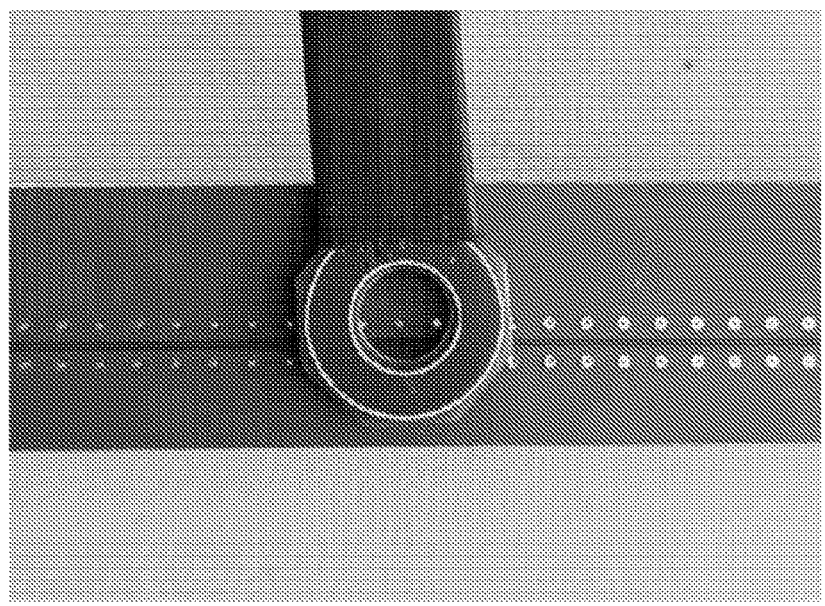
FIG. 9G shows an experimental setup to test detection of magnetic probing attacks.
Figure 9H:
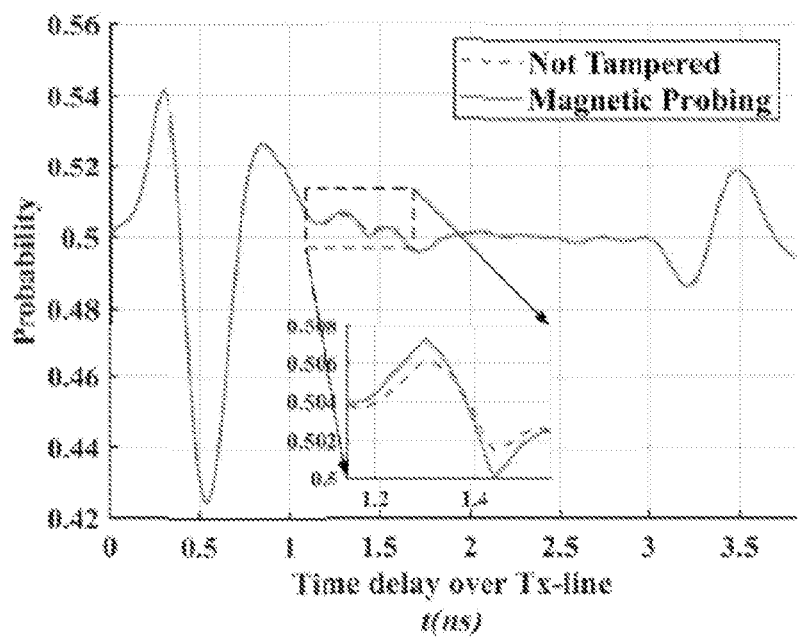
FIG. 9H shows a comparison of IIPs with and without magnetic probing.
Figure 9I:
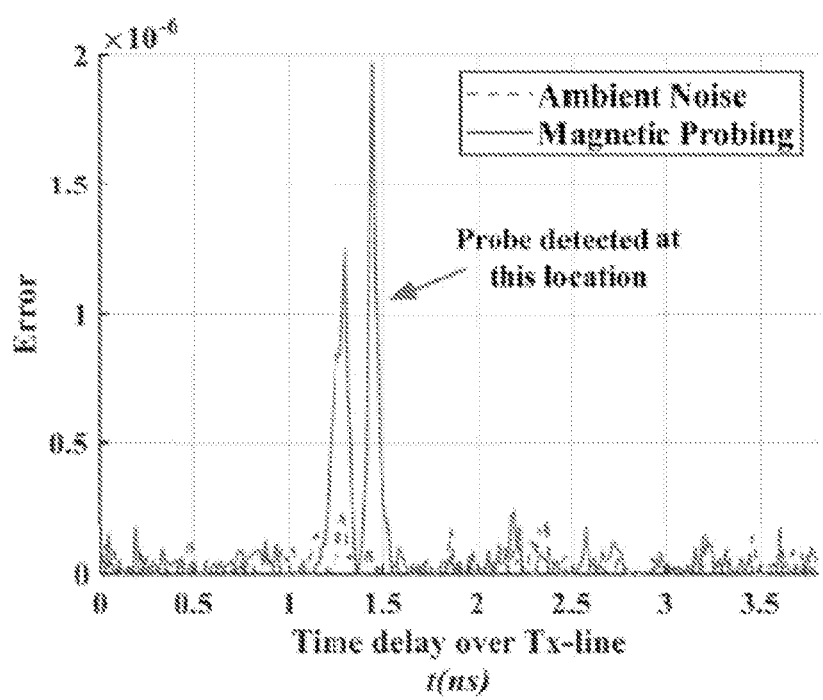
FIG. 9I shows a comparison of $E_{xy}(t)$ with and without magnetic probing.

Magnetic probing is typically considered a non-invasive side channel attack, as the magnetic probe gathers data without the need to touch the Tx-line. However, the existence of a magnetic probe in proximity with a Tx-line perturbs the magnetic field associated with the PCB Tx-line, i.e. microstrip, inducing Eddy currents in the magnetic probe, which in turn generate a magnetic field to oppose the original. Thus, equivalently, it introduces a mutual inductance to the PCB Tx-line, modifying the line inductance locally. Overall, theory suggests that the present invention is capable of not just detecting magnetic probing, but also locating it along a Tx-line. FIG. 9G shows the setup of a magnetic probing attack, FIG. 9H shows the IIP before and after the magnetic probe was applied, and FIG. 9I shows the $E_{xy}$ of two IIPs before and after applying a magnetic probe on the Tx-line. For better comparison, the $E_{xy}$ between the intact IIP taken at two different time points is plotted in the dotted line shown in FIG. 9I. Although the difference between IIPs before and after applying the magnetic probe is relatively small, the large peaks (contrast) in the error function graph clearly demonstrate the capability of the present invention to detect magnetic probing by setting the threshold at $5 \times 10^{-7}$. Since magnetic probing produces the smallest error increase of all of the tested attacks, this threshold also works in detecting other tampers previously mentioned. DIVOT is also capable of revealing the location of magnetic probing along a bus, as shown in FIG. 9I.

Note that in the specification and claims and appendix, "about" or "approximately" means within twenty percent (20%) of the numerical amount cited. As used herein, the singular forms "a," "an," and "the" include plural referents unless the context clearly dictates otherwise. Thus, for example, reference to "a functional group" refers to one or more functional groups, and reference to "the method" includes reference to equivalent steps and methods that would be understood and appreciated by those skilled in the art, and so forth.

Although the invention has been described in detail with particular reference to the disclosed embodiments, other embodiments can achieve the same results. Variations and modifications of the present invention will be obvious to those skilled in the art and it is intended to cover all such modifications and equivalents. The entire disclosures of all patents and publications cited above are hereby incorporated by reference.

What is claimed is:

1. A method of detecting an impedance change in a transmission line, the method comprising:
    embedding a time domain reflectometer (TDR) circuit in a computer chip, the TDR circuit comprising a comparator;
    transmitting a test signal through the transmission line;
    a positive input of the comparator receiving a back reflection voltage waveform from an input of the transmission line, the waveform derived from the test signal;
    a negative input of the comparator receiving a modulation signal;
    the comparator producing a probability density function;
    changing a phase of a TDR circuit sampling clock relative to a phase of a data transmission clock;
    calculating a reference impedance inhomogeneity pattern (IIP) of the transmission line;
    the transmission line performing normal data transfer during normal use of the transmission line;
    a positive input of the comparator receiving a back reflection voltage waveform from an input of the transmission line, the waveform derived from already-existing data being transferred through the transmission line during the performing step;
    a negative input of the comparator receiving a modulation signal;
    the comparator producing a probability density function;
    changing a phase of a TDR circuit sampling clock relative to a phase of a data transmission clock;
    calculating an operational impedance inhomogeneity pattern (IIP) of the transmission line;
    comparing the operational IIP to the reference IIP; and
    determining if an impedance of the transmission line has changed.

2. The method of claim 1 wherein the modulation signal comprises a quasi-triangle waveform.

3. The method of claim 1 wherein the changing step is performed using a phase lock loop (PLL).

4. The method of claim 1 wherein the computer chip comprises a central processing unit (CPU) chip or a memory chip.

5. The method of claim 1 wherein the repeating and comparing steps are performed within 50 μs.

6. The method of claim 1 performed with a probability of detecting an impedance change of approximately 1 with an equal error rate of less than approximately 0.06%.

7. The method of claim 1 wherein the method does not interfere with the normal data transfer through the transmission line.

8. The method of claim 1 performed without using a multibit analog to digital converter or a sample and hold circuit.

9. The method of claim 1 comprising generating the modulation signal using a resistor-capacitor circuit.

* * * * *